United States Patent [19]

Klement et al.

[11] Patent Number: 5,001,722
[45] Date of Patent: Mar. 19, 1991

[54] DYNAMIC SINGLE-MODE LASER TRANSMITTER

[75] Inventors: Ekkehard Klement, Graefelfing Staatsangehoerigkeit; Evelyn Keil, Munich; Hans-Ludwig Althaus, Lappersdorf; Ewald Hoermann, Holkirchen, all of Fed. Rep. of Germany

[73] Assignee: Siemens Aktiengesellschaft, Berlin and Munich, Fed. Rep. of Germany

[21] Appl. No.: 219,578

[22] Filed: Jul. 15, 1988

[30] Foreign Application Priority Data

Sep. 25, 1987 [DE] Fed. Rep. of Germany ....... 3732409

[51] Int. Cl.$^5$ ............................................. H01S 3/08
[52] U.S. Cl. ........................................ 372/99; 372/107
[58] Field of Search ............... 372/43, 99, 107, 108; 29/400 D; 72/412, 415

[56] References Cited

U.S. PATENT DOCUMENTS

| 3,835,414 | 9/1974 | Ahearn | 372/43 |
| 4,221,468 | 9/1980 | Macken | 372/99 |
| 4,485,474 | 11/1984 | Osterwalder | 372/44 |
| 4,528,836 | 7/1985 | Durand-Texte | 72/412 |
| 4,630,278 | 12/1986 | Auffrett et al. | 372/108 |
| 4,748,632 | 5/1988 | Preston | 372/107 |

FOREIGN PATENT DOCUMENTS 0106429  7/1982  Japan ...................................... 72/412

OTHER PUBLICATIONS

SFEB 14 (1985), pp. 289, 294.
Optical Comm. 13 (1975), pp. 130–132.
11th European Conference on Opt. Comm., (1985) Venedig.
Article Electron. Lett. 17 (1981), pp. 961–963.
Article Electron. Lett. 18 (1982), pp. 410–411.
Article Electron. Lett. 19 (1983), pp. 415–417.

Primary Examiner—William L. Sikes
Assistant Examiner—Robert E. Wise
Attorney, Agent, or Firm—Hill, Van Santen, Steadman & Simpson

[57] ABSTRACT

A dynamic single-mode laser transmitter which is formed with a multi-mode semiconductor laser (1) and an external resonator in the form of a mirror (21) mounted adjacent an exit face (12) of the laser (1) which emits laser light (20) which can be manufactured in a simple manner and is compact and particularly temperature stable and wherein the mirror (21) is formed on the end face (22) of a metal member (2) which is fixed to a common carrier member (3) that also carries the semiconductor laser (1). The laser transmitter of the invention can be used in optical communicatoin and in broadband systems for example.

14 Claims, 2 Drawing Sheets

DYNAMIC SINGLE-MODE LASER TRANSMITTER

BACKGROUND OF THE INVENTION

1. Field of the Invention

This invention relates in general to a dynamic single-mode laser transmitter wherein an external resonator in the form of a mirror is mounted a fixed distance from an exit face of a laser which emits laser light and the mirror reflects the laser light thus emitted back to the laser and where both the mirror and the laser are mounted on a common carrier member.

2. Description of the Prior Art

Laser transmitters which are dynamically single-mode, in other words, only oscillate in a longitudinal mode with modulation are required for optical communication transmission systems which have large band widths and wherein the wavelength lies outside of the dispersion minimum of the optical fiber. Such dynamically single-mode laser transmitters are referred to as DSM laser transmitters.

DSM laser transmitters can be constructed using DFB lasers as is discussed in the Electron. Lett. 17 (1981) at pages 961-963. DSM laser transmitters can be constructed with DBR lasers as discussed in Electron. Lett. 18 (1982) Pages 410-411. DSM laser transmitters can be constructed with $C^3$-lasers as is discussed in Electron. Lett. 19 (1983) at pages 415-417. DSM laser transmitters can be formed from coupled laser arrays as discussed in SFEB 14 (1985) at pages 289-294. Such DSM laser transmitters can also be constructed by coupling a short external resonator to a multi-mode laser diode. When using a DSM laser transmitter which comprises a short external resonator, an additional mirror that reflects the light back into the laser is mounted in front of one of the two exit faces of the laser diodes. The external resonator is then formed by this mirror and the one exit face. Since the laser beam emitted by the laser diode is generally highly divergent, the back reflection into the laser mode is relatively slight with a planar mirror. So as to increase the quality, a spherical mirror (as discussed in Opt. Commun. 13 (1975) Pages 130-132, the Eleventh European Conference on Opt. Comm. 1985 Venice or Collimation Optics as described in Opt. Fiber Comm. of January 1985, New Orleans is usually employed.

DSM laser transmitters comprising an external resonator have the advantage as compared to DFB lasers they are relatively simple and thus inexpensive multi-mode lasers as, for example, MCRW lasers which are easy to obtain can be employed.

Difficulties arise in using a hybrid arrangement of the semiconductor laser with the coupled resonator because they must be mechanically stable relative to each other with the tolerance of about 0.1 micrometer.

SUMMARY OF THE INVENTION

It is an object of the present invention to provide a laser transmitter that can be manufactured in a simple manner and which is compact and stable.

A dynamic single mode laser transmitter is formed of a multi-mode semiconductor laser and has an external resonator which comprises a mirror mounted at a distance d from an exit face of the laser which emits laser light and the mirror reflects the laser light which is emitted divergently from the exit facet back to the laser and wherein the mirror is formed on an end face of a metal member that is attached to a common carrier member that also carries a semiconductor laser.

Another feature of the present invention is that the mirror is formed in a concave polished end face of the metal member which reflects the laser light back to the laser in a convergent beam. Another feature of the invention is that the metal member is formed of copper and that the end face of the metal member is coated with a gold layer. Another feature of the invention is that the metal member is composed of Pt-Rh.

It is another feature of the invention that the radius of curvature of the concave end face 22 of the metal member 2 is in the range between 0.3 through 0.5 times the optical length of the laser.

Another feature of the invention is that the mirror is formed of a photo diode which is attached to the end face of the metal member with a light receiving face of the diode facing toward the one exit face of the laser being reflective.

Another feature of the invention is that the side of the photodiode which faces toward the one exit face of the laser is coated with a dielectric mirror layer.

The metal member may be generally cylindrical-shaped and may have a diameter in the range of 0.4-0.6 mm.

The optical length of the laser is the products n·L wherein n is the refractive index in the laser and L is the geommetrical length of the laser.

A monitoring diode for monitoring the output power of the semiconductor layers in the laser transmitter could be mounted adjacent to or above the mirror so that a part of the light reflected by the mirror can be detected and can be used for controlling the power of the laser.

An advantageous second modification of the laser transmitter utilizes a monitor diode and in the second modification the diode is also used as a mirror. A diode that is not coated with anti-reflection layer is satisfactory for such operation.

So as to increase the back reflection caused by the diode, the side of the photo diode facing toward the one exit face of the laser can be coated with a dielectric mirror layer.

Generally, the metal member and the laser transmitter of the invention is a cylindrical-shape metal and the mirror is formed on one end face of this metal member. The metal member can be short and the metal member may preferably have a diameter of 0.4-0.6 mm as, for example, 0.5 mm.

The metal member and the laser may be mounted on a common supporting block which is formed of a material that has poor thermal conductivity as compared to the material of the carrier member and the block is fixed on the carrier member.

It is a feature of the invention that the carrier member has a step that separates a higher attaching face from a lower attaching face and the semiconductor laser is attached to the higher attaching face and the block of material having relatively poor thermal conductivity is attached to the lower attaching face of the block.

It is a feature of the invention that the block may be formed of silica glass having relatively poor conductivity and the surface of the block to which the metal member is attached may be metallized.

Another feature of the invention is to provide for a method for manufacturing the invention.

Other objects, features of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
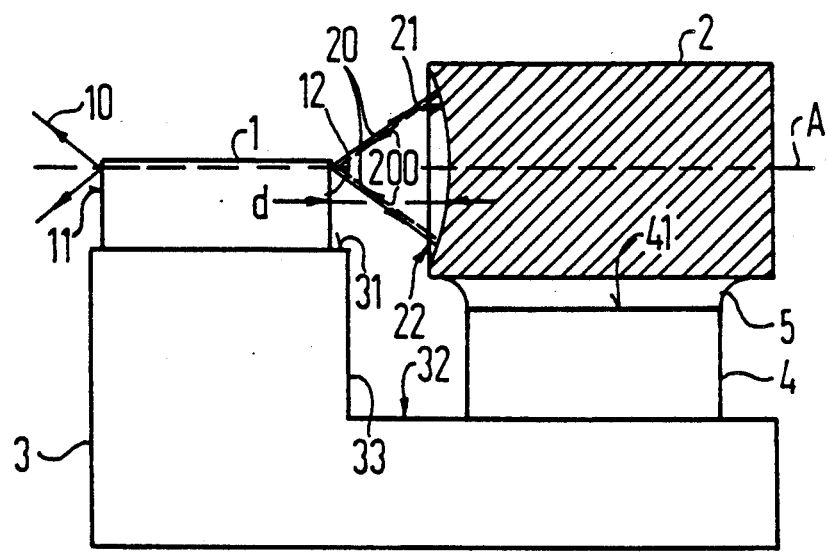
FIG. 1 is a side plan view of a laser transmitter which includes an external resonator formed as a concave mirror at the end of a short metal cylinder which is shown in sectional view.
Figure 2:
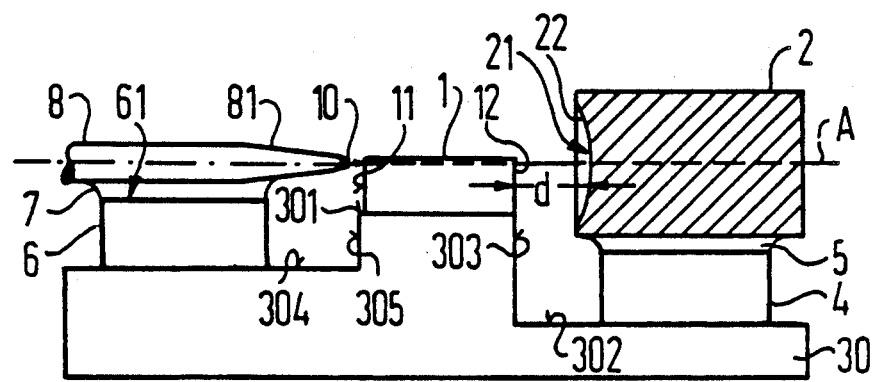
FIG. 2 illustrates a modification of the invention which includes a transmission module comprising a tapered optical fiber mounted with the laser of FIG. 1.
Figure 3:
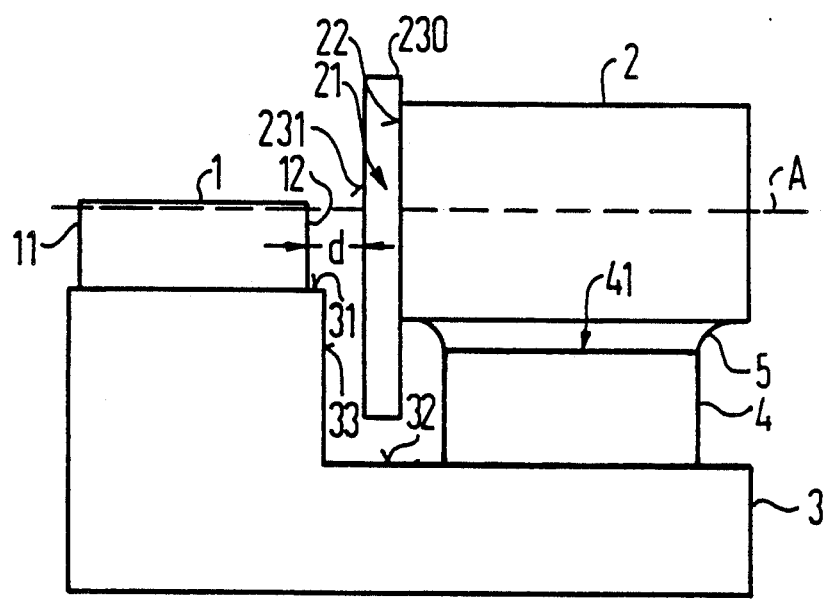
FIG. 3 is a modification of the invention and comprises a side view of a laser transmitter including a diode which is not coated with an anti-reflection layer which is fixed to the end of the short metal member wherein the diode forms the external resonator and also a monitoring diode.

The various elements in FIGS. 1, 2 and 3 are not true to scale. FIG. 1 illustrates a transmitter which includes a carrier member 3 formed with a step 33 upon which is formed a first fixing face 31 which is higher than a fixing face 32 of the carrier member. The semiconductor laser (1) is attached to the higher fixing face 31 and a block 4 which may be formed of silica glass or some other material that has a poor thermal conductivity relative to the material of the carrier member 3 is attached to the lower attaching face 32. The block 4 should be composed of a material having poor heat conducting properties and the carrier member 3 should be formed of material which has good thermal conductivity as, for example, metal.

A short piece of metal 2, as, for example, of cylindrical shape is attached to the block 4 by solder 5. The short piece of metal 2 has a concave end face 22 which forms a concave mirror that is opposite the one exit face 12 of the laser 1 from which the laser emission divergently emerges. With the correct positioning of the piece of metal 2 such that it is aligned with the optical axis A of the laser 1, the concave mirror 21 will reflect the laser emission 20 back to the laser in a convergent beam 200.

When the piece of metal 2 is attached with solder 5 to the surface 41 of block 4 of silica glass, the surface 41 may be provided with a metallization which combines with the solder 5.

The laser light 10 emitted from the other exit face 11 of the laser 1 is the emitted light of the transmitter.

The transmitter of FIG. 1 can be modified to form a transmission module as shown in FIG. 2, for example. An end section 8 of optical fiber is mounted adjacent the other exit face 11 of the laser 1 so as to receive the laser energy 10. In the transmission module of FIG. 2, a carrier member 30 is formed with steps 303 and an additional step 305. The step 303 separates a higher fixing face 301 of the carrier member 30 from a lower fixing face 302 of the carrier member. The step fixing face 301 is utilized for mounting the laser 1 thereon and the fixing face 302 is utilized for mounting the block 4 which carries the short piece of metal 2 thereon. The additional step 305 formed at the side of the other exit face 11 of the laser 1 separates a higher fixing face 301 from a lower fixing face 304. An additional block 6 of silica glass or of some other material that has poor thermal conductivity as compared to the material of the carrier member 30 is attached to the fixing face 304. The block 6 has poor thermal conductivity and the carrier member 30 should be composed of material having good thermal conductivity as, for example, metal.

The end section 8 of an optical fiber is formed with a tapered end 81 and the end section 8 is attached with solder 7 to the surface 61 of the block 6 as shown. This is also described in European Patent Application No. 0 204 224.

FIG. 3 illustrates a further modification of the invention. This embodiment differs from the embodiment of FIG. 1 in that a mirror 21 is not formed as a concave mirror but comprises a photo diode 230 which is attached to the end face 22 of the piece of metal 2 such that the light receiving face 231 of the diode 230 faces toward the one exit face 12 of the laser 1 and such face is not coated with an anti-reflection material and, thus, it reflects.

Due to the coupling of the external resonator in the form of the mirror 21, the threshold of the semiconductor laser 1 decreases directly as the back reflection of the light from the mirror into the laser 1 increases. If the laser current is held constant, increase of the light power emerging from the other exit face 11 can be used as a simple adjustment criteria for the mirror 21.

So as to position and solder the piece of metal 2, it is held with adjustable tweezers comprising two clamping jaws of high resistant material. When electrical voltage is applied to the two tweezer arms and when the circuit is closed through the clamping jaws and the piece of metal 2 then the wire can be heated to a soldering temperature. The mirror 21 can then be adjusted in front of the laser 1 and can be fixed after the current is disconnected. The high thermal resistance of the block 4 and the cooling of the carrier member 3 or, respectively, 30 prevents the semiconductor laser from being too greatly heated during the soldering process.

The mirror 21 in FIGS. 1 and 2 which are formed as a concave mirror can be produced by pressing a commercially obtainable microsphere as, for example, of sapphire into the end face of the metal piece 2.

In one exemplary embodiment, a piece 2 which was formed of a polish and Pt-Rh cylinder which has an impressed concave mirror with a 0.5 mm radius was adjusted relative to a MCRW laser diode having an emission wavelength $\lambda = 1.3$ mm and was soldered to the carrier member 3. The side modes suppression was about 24 dB. Such side mode suppression remains stable over a temperature range of about 10° C. in continuous wave mode.

Although the invention has been described with respect to preferred embodiments, it is not to be so limited as changes and modifications can be made which are within the full intended scope of the invention as defined by the appended claims.

We claim as our invention:

1. A dynamic single-mode laser transmitter comprising, a multimode semiconductor laser (1) mounted on a carrier member (3, 30) comprising an external resonator in the form of a mirror (21) mounted at a distance (d) from a first exit face (12) of said laser (1) which emits laser light (20), said mirror (21) reflecting said laser light (20) which is emitted divergently from said first exit face (12) back to the laser, said mirror (21) formed on an end face (22) of a metal member (2) that is attached to said carrier member (3, 30) upon which said semiconductor laser (1) is mounted, and wherein said mirror (21) is a photodiode (230) which is fixed to said end face (22) of said metal member (2), whereby a light-receiving face of said diode (230) which faces toward said first exit face (12) of said laser (1) is reflective.

2. A dynamic single-mode transmitter according to claim 1, wherein the side (231) of the photodiode (23) which faces toward said first exit face (12) of said laser (1) is coated with a dielectric mirror layer (232).

3. A dynamic single-mode laser transmitter comprising, a multimode semiconductor laser (1) mounted on a carrier member (3, 30) comprising an external resonator in the form of a mirror (21) mounted at a distance (d) from a first exit face (12) of said laser (1) which emits laser light (20), said mirror (21) reflecting said laser light (20) which is emitted divergently from said first exit face (12) back to the laser, said mirror (21) formed on an end face (22) of a metal member (2) that is attached to said carrier member (3, 30) upon which said semiconductor laser (1) is mounted, wherein said mirror (21) is formed of an inwardly depressed polished end face (22) of said metal member (2) which reflects the laser light (20) emitted by said first exit face (12) of said laser (1) back to the laser (1) in a convergent beam (200), wherein said metal member (2) is formed of copper; and said end face (22) of said member (2) is coated with a layer of gold, and wherein said metal member (2) is cylindrically shaped and said mirror (21; 23) is formed on an end face (22) of said metal member, and wherein said metal member (2) is mounted on a block (4) formed of a material that has poor thermal conductivity as compared to the material of said carrier member (3, 30) and said block (4) is fixed to said carrier member (3, 30).

4. A dynamic single-mode transmitter according to claim 3, wherein said cylindrically shaped metal member has a diameter in the range of 0.4 to 0.6 mm.

5. A dynamic single-mode laser transmitter comprising, a multimode semiconductor laser (1) mounted on a carrier member (3, 30) comprising an external resonator in the form of a mirror (21) mounted at a distance (d) from a first exit face (12) of said laser (1) which emits laser light (20), said mirror (21) reflecting said laser light (20) which is emitted divergently from said first exit face (12) back to the laser, said mirror (21) formed on an end face (22) of a metal member (2) that is attached to said carrier member (3, 30) upon which said semiconductor laser (1) is mounted, wherein said mirror (21) is formed of an inwardly depressed polished end face (22) of said metal member (2) which reflects the laser light (20) emitted by said first exit face (12) of said laser (1) back to the laser (1) in a convergent beam (200, wherein said metal member (2) is formed of copper; and said end face (22) of said member (2) is coated with a layer of gold; and wherein said semiconductor laser (1) is fixed directly on said carrier member (3; 30) and said metal member (2) is mounted on a block (4) formed of a material that has poor thermal conductivity as compared to the material of said carrier member (3; 30), and said block (4) is fixed to said carrier member (3; 30).

6. A dynamic single-mode transmitter according to claim 5, wherein said carrier member (3; 30) has a step (33; 303) that separates a more higher fixing face (31; 301) of said carrier member (3; 30) from a lower disposed fixing face (32; 302) of said member; and said semiconductor laser (1) is fixed on said higher fixing face (31, 301) and said block (4) of material which has relatively poor thermal conductivity is fixed to the lower fixing face (32, 302) of said block (4).

7. A dynamic single-mode transmitter according to claim 6, wherein said block (4) is formed of silica glass which has a relatively poor conductivity; and a surface (41) of said block (4) to which said metal member (2) is fixed is metallized.

8. A dynamic single-mode transmitter according to claim 6, wherein said carrier member has a further step (305) at a second exit face (11) of said laser (1) which emits laser light (10) which faces away from said first exit face (12) of the semiconductor laser (1), said further step (305) lying between said higher fixing face (301) and said lower fixing face (302) which is arranged at the side of said first exit face (11) and a further block (6) of a material having poor thermal conductivity as compared to the material of said carrier member (30) is fixed and an end section (8) of a fiber into which the laser light (10) which is divergently emitted from said second exit face (11) is coupled is attached to said further block (6) at a location opposite said second exit face (11) of said laser (1).

9. A dynamic single-mode transmitter according to claim 8, wherein said end section (8) of the fiber has a tapered shape (8).

10. A method for manufacturing a laser transmitter comprising the steps of, attaching a semiconductor laser (1) and a block (4) formed of material which has a relatively poor thermal conductivity on a carrier member (3, 30) and fixing a metal member (2) with a mirror (21, 23) on said block (4) with solder (5) with said block 4 of thermal conductivity less than said metal member and said carrier member mounted between said metal member (2) and said carrier member (3, 30).

11. A method for manufacturing a mirror (21) comprising the steps of forming an inwardly arced end face (22) in a metal member by pressing a sphere of hard material into the polished end face (22) of said metal member (2).

12. A method according to claim 11, wherein said sphere is of saphire.

13. A method according to claim 11, wherein said metal member (2) is formed of copper; and said end face (22) of said member (2) is coated with a layer of gold.

14. A method according to claim 11, wherein said metal member (2) is formed of platinum-rhodium.

* * * * *